(12) United States Patent
Cical et al.

(10) Patent No.: US 10,608,630 B1
(45) Date of Patent: Mar. 31, 2020

(54) METHOD OF INCREASED SUPPLY REJECTION ON SINGLE-ENDED COMPLEMENTARY METAL-OXIDE-SEMICONDUCTOR (CMOS) SWITCHES

(71) Applicant: Xilinx, Inc., San Jose, CA (US)

(72) Inventors: Ionut C. Cical, Saggart (IE); Diarmuid Collins, Dunshaughlin (IE); John K. Jennings, Glenageary (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/019,150

(22) Filed: Jun. 26, 2018

(51) Int. Cl.
*H03K 17/687* (2006.01)
*H03K 17/16* (2006.01)
*G05F 1/44* (2006.01)
*H03M 1/34* (2006.01)

(52) U.S. Cl.
CPC .......... *H03K 17/6872* (2013.01); *G05F 1/44* (2013.01); *H03K 17/161* (2013.01); *H03M 1/34* (2013.01)

(58) Field of Classification Search
USPC ................................................. 327/108–112
See application file for complete search history.

(56) References Cited

U.S. PATENT DOCUMENTS

| | | | | |
|---|---|---|---|---|
| 5,644,265 A * | 7/1997 | Austin | ............. | H03K 19/00315 327/333 |
| 5,680,300 A * | 10/1997 | Szepesi | .................... | H02M 3/07 363/59 |
| 5,705,919 A * | 1/1998 | Wilcox | .................... | G05F 1/618 323/268 |
| 5,850,153 A * | 12/1998 | Harris | ............. | H03K 19/00315 326/58 |
| 7,091,752 B2 * | 8/2006 | Balakrishnan | .... | H02M 3/33592 327/108 |
| 7,307,458 B1 * | 12/2007 | Segervall | ............ | G06F 13/4072 326/30 |
| 8,077,497 B2 * | 12/2011 | Ogata | ................ | G11C 13/0007 365/100 |
| 8,120,391 B2 * | 2/2012 | Bayerer | ............. | H03K 17/0406 327/108 |
| 8,310,329 B1 * | 11/2012 | Herbert | ............... | H01F 27/2804 336/186 |
| 8,854,019 B1 * | 10/2014 | Levesque | ................ | H02M 3/07 323/266 |
| 9,245,886 B2 | 1/2016 | Jennings et al. | | |
| 2002/0097627 A1 * | 7/2002 | Sacco | .................... | G11C 5/147 365/226 |

(Continued)

*Primary Examiner* — Adam D Houston
(74) *Attorney, Agent, or Firm* — William L. Paradice, III; Yipeng Li

(57) ABSTRACT

A complementary metal-oxide-semiconductor (CMOS) switching system with increased supply rejection is disclosed. The system comprises a voltage regulator and a CMOS circuit. The voltage regulator receives a supply voltage and generates a regulated voltage by regulating an amplitude of the received supply voltage. The CMOS circuit includes an input terminal to receive a first voltage, switching circuitry to selectively couple the CMOS circuit to the voltage regulator in one of a plurality of configurations, and an output terminal to output a second voltage based at least in part on the first voltage and the regulated voltage when the CMOS circuit is coupled to the voltage regulator in a first configuration of the plurality of configurations.

18 Claims, 5 Drawing Sheets

(56) References Cited

U.S. PATENT DOCUMENTS

| | | | | |
|---|---|---|---|---|
| 2002/0171374 A1* | 11/2002 | Yasui | H05B 6/685 | 315/219 |
| 2005/0024103 A1* | 2/2005 | Nascimento | H03K 17/0406 | 327/112 |
| 2005/0218943 A1* | 10/2005 | Padhye | G06F 1/3203 | 327/109 |
| 2005/0219158 A1* | 10/2005 | Shoji | G09G 3/2946 | 345/63 |
| 2005/0219875 A1* | 10/2005 | Millner | H02M 7/53871 | 363/56.01 |
| 2007/0023399 A1* | 2/2007 | Buhler | B23H 1/022 | 219/69.18 |
| 2007/0152750 A1* | 7/2007 | Andersen | H03F 1/32 | 330/136 |
| 2008/0150858 A1* | 6/2008 | Nishi | G09G 3/20 | 345/87 |
| 2009/0160495 A1* | 6/2009 | Chen | H04L 25/0276 | 327/108 |
| 2009/0289693 A1* | 11/2009 | Motamed | H03K 19/00315 | 327/437 |
| 2009/0302814 A1* | 12/2009 | Kapels | H02M 3/1588 | 323/282 |
| 2010/0308739 A1* | 12/2010 | Shteynberg | H05B 33/083 | 315/193 |
| 2011/0140682 A1* | 6/2011 | Iizuka | G05F 1/575 | 323/311 |
| 2011/0182446 A1* | 7/2011 | Shajaan | H02M 3/156 | 381/150 |
| 2011/0300816 A1* | 12/2011 | Collados | H04L 27/04 | 455/102 |
| 2012/0044722 A1* | 2/2012 | Cuk | H02M 3/335 | 363/21.03 |
| 2012/0206170 A1* | 8/2012 | Kimura | H03K 17/04123 | 327/109 |
| 2012/0223686 A1* | 9/2012 | Lin | G05F 1/563 | 323/270 |
| 2012/0229212 A1* | 9/2012 | Konecny | H03F 3/2173 | 330/251 |
| 2013/0257541 A1* | 10/2013 | Lugiez | H03F 3/211 | 330/295 |
| 2013/0278453 A1* | 10/2013 | Steensgaard-Madsen | H03M 1/0668 | 341/110 |
| 2014/0321008 A1* | 10/2014 | Keane | H01H 11/00 | 361/56 |
| 2014/0327422 A1* | 11/2014 | Rommel | H03K 17/0822 | 323/283 |
| 2015/0188532 A1* | 7/2015 | Lenz | H03K 5/023 | 327/109 |
| 2015/0318855 A1* | 11/2015 | Song | H03K 19/0013 | 327/108 |
| 2015/0356909 A1* | 12/2015 | Lim | H03K 17/162 | 345/205 |
| 2015/0358011 A1* | 12/2015 | Tang | H03K 5/1534 | 327/109 |
| 2015/0372672 A1* | 12/2015 | Ohashi | H03K 17/08122 | 327/109 |
| 2016/0061905 A1* | 3/2016 | Kikuchi | H03K 17/687 | 324/434 |
| 2016/0087627 A1* | 3/2016 | Jang | H03K 17/6871 | 345/214 |
| 2017/0054306 A1* | 2/2017 | Vo | H01M 10/4257 | |
| 2017/0093403 A1* | 3/2017 | Wilson | H03K 19/018528 | |
| 2017/0179827 A1* | 6/2017 | Cheng | H02M 1/32 | |
| 2017/0229955 A1* | 8/2017 | Schober | H02M 3/07 | |
| 2017/0264288 A1* | 9/2017 | Wu | H03K 17/6872 | |
| 2018/0198430 A1* | 7/2018 | Link | H03F 1/025 | |
| 2018/0226817 A1* | 8/2018 | Heiling | H02J 7/0034 | |
| 2018/0348075 A1* | 12/2018 | Rubinstein | F17C 1/00 | |
| 2018/0351769 A1* | 12/2018 | Tajalli | H03K 17/6871 | |
| 2019/0103750 A1* | 4/2019 | Kristensen | H02J 7/0026 | |
| 2019/0103824 A1* | 4/2019 | Kim | H02N 2/181 | |
| 2019/0140635 A1* | 5/2019 | Abesingha | H03K 17/08122 | |

* cited by examiner

METHOD OF INCREASED SUPPLY REJECTION ON SINGLE-ENDED COMPLEMENTARY METAL-OXIDE-SEMICONDUCTOR (CMOS) SWITCHES

TECHNICAL FIELD

Aspects of the present disclosure generally relate to integrated circuits, and specifically to increasing supply rejection for complementary metal-oxide-semiconductor (CMOS) switches.

BACKGROUND

A complementary metal-oxide-semiconductor (CMOS) circuit may operate as a switch, for example, to sample voltages that are received at an input. A typical CMOS circuit may be formed by an N-type metal-oxide-semiconductor (NMOS) transistor coupled in parallel with a P-type metal-oxide-semiconductor (PMOS) transistor, such that the NMOS transistor and PMOS transistor share a common input and a common output. The gates of the PMOS transistor and the NMOS transistor are controlled by complementary signals that may be used for activating or "turning on" the transistors. More specifically, when the transistors are turned on (e.g., when the enable signal is asserted), the CMOS switch allows the input to pass to the output. Thus, the output at any given time represents the voltage sampled on the input when the enable signal is asserted.

Analog CMOS switches typically exhibit poor supply rejection. Specifically, the output of a CMOS switch is susceptible to disturbances on a voltage supply line powering the CMOS circuitry. For example, a CMOS switch is typically activated when the gate of the NMOS transistor is coupled to a voltage supply line, which provides a relatively high "turn-on" voltage. However, parasitic capacitances between the gate and source (or drain) of the NMOS transistor may couple noise from the voltage supply line to the source terminal of the NMOS transistor, which may introduce voltage errors at the output of the CMOS switch. Thus, it may be desirable to reduce or minimize the coupling of noise from the voltage supply line to the output of the CMOS switch.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to a complementary metal-oxide-semiconductor (CMOS) switching system with increased supply rejection. An example CMOS switching system includes a voltage regulator and a CMOS circuit. The voltage regulator receives a supply voltage and generates a regulated voltage by regulating an amplitude of the received supply voltage. For example, the voltage regulator may be configured to attenuate noise in the supply voltage to stabilize an amplitude of the regulated voltage. The CMOS circuit includes an input terminal to receive a first voltage, switching circuitry to selectively couple the CMOS circuit to the voltage regulator in one of a plurality of configurations, and an output terminal to output a second voltage based at least in part on the first voltage and the regulated voltage when the CMOS circuit is coupled to the voltage regulator in a first configuration of the plurality of configurations.

In some aspects, the CMOS circuit may include an N-type metal-oxide-semiconductor (NMOS) transistor to generate the second voltage when the first voltage is below a threshold voltage level. In some embodiments, the NMOS transistor may comprise a drain coupled to the input terminal, a source coupled to the output terminal, and a gate switchably coupled to one of the voltage regulator or a ground potential via a first switch of the switching circuitry. For example, the first switch may be configured to couple the gate of the NMOS transistor to the voltage regulator in the first configuration.

In some aspects, the CMOS circuit may include a P-type metal-oxide-semiconductor (PMOS) transistor to generate the second voltage when the first voltage is above a threshold voltage level. In some embodiments, the PMOS transistor may comprise a source coupled to the input terminal, a drain coupled to the output terminal, and a gate switchably coupled to one of the voltage regulator or a ground potential via a second switch of the switching circuitry. For example, the second switch may be configured to couple the gate of the PMOS transistor to the ground potential in the first configuration.

In some embodiments, the system may further comprise an analog-to-digital converter (ADC) to receive the second voltage from the CMOS circuit and the regulated voltage from the voltage regulator, and to convert the second voltage to a digital sample by comparing the second voltage to the regulated voltage. In some aspects, the regulated voltage may be configured for the sampling to be performed by the ADC. Thus, the CMOS circuit may leverage the existing regulated voltage of the ADC to perform its switching operations.

Another example CMOS switching system includes a voltage regulator and a CMOS circuit. The voltage regulator receives a supply voltage and generates a regulated voltage by regulating an amplitude of the received supply voltage. For example, the voltage regulator may be configured to attenuate noise in the supply voltage to stabilize an amplitude of the regulated voltage. The CMOS circuit comprises an NMOS transistor and a PMOS transistor. The NMOS transistor includes a drain coupled to an input terminal of the CMOS circuit, a source coupled to an output terminal of the CMOS circuit, and a gate switchably coupled to the voltage regulator. The PMOS transistor includes a drain coupled to the output terminal of the CMOS circuit, a source coupled to the input terminal of the CMOS circuit, and a gate switchably coupled to the voltage regulator. The CMOS circuit further includes switching circuitry to selectively couple the gate of the NMOS transistor or the gate of the PMOS transistor to the voltage regulator.

In some embodiments, the switching circuitry may be configured to activate the CMOS circuit by coupling the gate of the NMOS transistor to the voltage regulator. In some other embodiments, the switching circuitry may be configured to deactivate the CMOS circuit by coupling the gate of the PMOS transistor to the voltage regulator. In some aspects, the CMOS circuit may be configured to receive a first voltage at the input terminal, and output a second voltage at the output terminal based at least in part on the first voltage and the regulated voltage when the gate of the NMOS transistor is coupled to the voltage regulator.

In some embodiments, the system may further comprise an ADC to receive the second voltage from the CMOS circuit and the regulated voltage from the voltage regulator, and to convert the second voltage to a digital sample by comparing the second voltage to the regulated voltage. In some aspects, the regulated voltage may be configured for the sampling to be performed by the ADC. Thus, the CMOS circuit may leverage the existing regulated voltage of the ADC to perform its switching operations.

An example method disclosed herein may be used to operate a CMOS circuit to perform switching operations. The method may include receiving a supply voltage, generating a regulated voltage by regulating an amplitude of the received supply voltage, and selectively providing the regulated voltage to a CMOS circuit in one of a plurality of configurations. For example, the regulated voltage may be generated by attenuating noise in the supply voltage to stabilize an amplitude of the regulated voltage. In some embodiments, the CMOS circuit may receive a first voltage, and output a second voltage based at least in part on the first voltage and the regulated voltage when the regulated voltage is provided to the CMOS circuit in a first configuration of the plurality of configurations.

In some aspects, the CMOS circuit may include an NMOS transistor to generate the second voltage when the first voltage is below a threshold voltage level. In some embodiments, the NMOS transistor may comprise a drain to receive the first voltage, a source to output the second voltage, and a gate to selectively receive the regulated voltage. For example, the step of selectively providing the regulated voltage to the CMOS circuit may include a step of providing the regulated voltage to the gate of the NMOS transistor in the first configuration.

In some aspects, the CMOS circuit may include a PMOS transistor to generate the second voltage when the first voltage is above a threshold voltage level. In some embodiments, the PMOS transistor may comprise a source to receive the first voltage, a drain to output the second voltage, and a gate to selectively receive the regulated voltage. In some embodiments, the method may further include a step of coupling a ground potential to the gate of the PMOS transistor in the first configuration.

In some embodiments, the method may further include a step of providing the regulated voltage to an ADC to cause the ADC to convert the second voltage to a digital sample by comparing the second voltage to the regulated voltage. In some aspects, the regulated voltage may be configured for the sampling to be performed by the ADC. Thus, the CMOS circuit may leverage the existing regulated voltage of the ADC to perform its switching operations.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Figure 1:
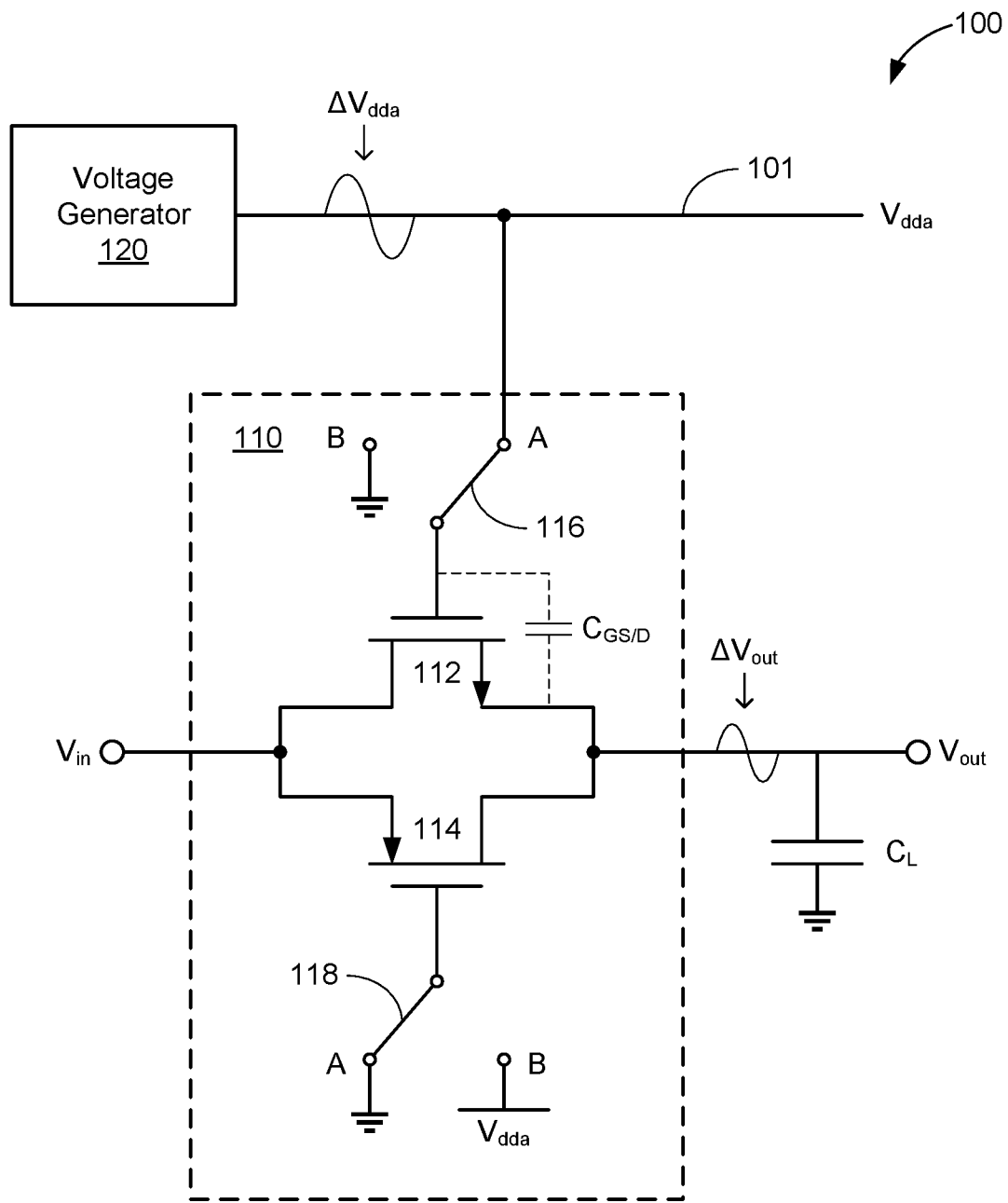
FIG. 1 shows an example CMOS switching system.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

As described above, complementary metal-oxide-semiconductor (CMOS) switch may be formed by an N-type metal-oxide-semiconductor (NMOS) transistor coupled in parallel with a P-type metal-oxide-semiconductor (PMOS) transistor, such that the NMOS transistor and PMOS transistor share a common input (e.g., the input terminal of the CMOS switch) and a common output (e.g., the output terminal of the CMOS switch). The CMOS switch may be activated when the gate of the NMOS transistor is coupled to a voltage supply line (e.g., which provides a relatively high "turn-on" voltage) and the gate of the PMOS transistor is coupled to a ground potential. However, parasitic capacitances between the gate and source (or drain) of the NMOS transistor (or PMOS transistor) may couple noise form the voltage supply line to the source terminal of the NMOS transistor, which may introduce voltage errors at the output of the CMOS switch. Thus, CMOS switches typically exhibit poor supply rejection.

Aspects of the present disclosure may reduce or minimize the coupling of noise from the voltage supply line to the output of the CMOS switch. In some embodiments, a CMOS switching system may include a voltage regulator coupled to a CMOS circuit. The voltage regulator receives a supply voltage and generates a regulated voltage by regulating an amplitude of the received supply voltage. For example, the voltage regulator may be configured to attenuate noise in the supply voltage to stabilize an amplitude of the regulated voltage. The regulated voltage may be used to selectively activate the CMOS circuit (e.g., by turning on the NMOS transistor). More specifically, the CMOS circuit may selectively generate an output voltage (e.g., at the output terminal of the CMOS circuit) based at least in part on an input voltage (e.g., at the input terminal of the CMOS circuit) and the regulated voltage when the regulated voltage is provided to the gate of the NMOS transistor.

Conventional methods of increasing supply rejection have focused on reducing the parasitic capacitance between the gate and source (or drain) of the NMOS transistor. However, reducing the parasitic capacitance of the NMOS transistor typically requires a corresponding reduction in the size of the CMOS circuitry, which may increase settling times and leakage currents of the CMOS switch. Aspects of the present disclosure may increase the supply rejection of a CMOS switch by addressing the source of the disturbance. For example, by reducing the noise in the voltage supply line powering the CMOS switch (e.g., rather than the parasitic coupling within the CMOS switch), the embodiments herein may reduce the error voltage at the output of the CMOS switch without altering the circuitry of the CMOS switch. Accordingly, the systems and methods of increasing supply noise rejection described herein may result in lower settling times and leakage currents of the CMOS switch compared to conventional methods of increasing the supply noise rejection of a CMOS switch.

FIG. 1 shows an example CMOS switching system 100. The CMOS switching system 100 includes a CMOS circuit 110 and a voltage generator 120. In some embodiments, the CMOS circuit 110 may operate as an analog switch based, at least in part, on a coupling of the CMOS circuit 110 to a voltage supply line 101. More specifically, the voltage generator 120 may drive the voltage supply line 101 with a control voltage $V_{dda}$ which may be used to activate and/or deactivate the CMOS circuit 110.

The CMOS circuit 110 includes an NMOS transistor 112 coupled in parallel with a PMOS transistor 114. In the example of FIG. 1, the drain of the NMOS transistor 112 is coupled to the source of the PMOS transistor 114 to collectively form an input terminal of the CMOS circuit 110. The input terminal of the CMOS circuit 110 may be configured to receive an input voltage $V_{in}$. The source of the NMOS transistor 112 is coupled to the drain of the PMOS transistor 114 to collectively form an output terminal of the CMOS circuit 110. The output terminal of the CMOS circuit 110 may be configured to provide an output voltage $V_{out}$. The gate of the NMOS transistor 112 is switchably coupled to the voltage supply line 101 (e.g., voltage generator 120) or a ground potential via a first switch 116, and the gate of the PMOS transistor 114 is switchably coupled to the voltage supply line 101 (e.g., voltage generator 120) or a ground potential via a second switch 118.

The switches 116 and 118 may be coupled in a first configuration (A) or a second configuration (B). In the first configuration (A), the first switch 116 couples the gate of the NMOS transistor 112 to the voltage supply line 101 and the second switch 118 couples the gate of the PMOS transistor 114 to the ground potential. More specifically, when the switches 116 and 118 are in the first configuration, the NMOS transistor 112 and PMOS transistor 114 are turned on, thus activating the CMOS circuit 110 (e.g., causing the CMOS circuit 110 to operate in a conducting state). In the second configuration (B), the first switch 116 couples the gate of the NMOS transistor 112 to the ground potential and the second switch 118 couples the gate of the PMOS transistor 114 to the voltage supply line 101. More specifically, when the switches 116 and 118 are in the second configuration, the NMOS transistor 112 and PMOS transistor 114 are turned off, thus deactivating the CMOS circuit 110 (e.g., causing the CMOS circuit 110 to operate in a non-conducting state). In some implementations, the switches 116 and 118 may be controlled by an enable signal (not shown for simplicity).

When the switches 116 and 118 are in the first configuration (A), the CMOS circuit 110 may transfer charge or current at the input terminal (e.g., $V_{in}$) to the output terminal. In some embodiments, the charge or current transferred to the output terminal may be accumulated and stored across a capacitive load ($C_L$). Thus, the voltage at the output terminal (e.g., $V_{out}$) may correspond to the charge stored across the capacitive load $C_L$. The NMOS transistor 112 may facilitate the transfer of relatively-low input voltages $V_{in}$ to the output terminal of the CMOS circuit 110, whereas the PMOS transistor 114 may facilitate the transfer of relatively-high input voltages $V_{in}$ to the output terminal of the CMOS circuit 110.

For example, a conductive path may be formed across the channel of the NMOS transistor 112 when the voltage at the gate exceeds the voltage at the drain by at least a threshold voltage (e.g., $V_{GD} \geq V_{TH}$). However, the channel breaks down when the gate-to-source voltage of the NMOS transistor 112 falls below the threshold voltage $V_{TH}$ (e.g., $V_{GS} < V_{TH}$). As a result, the NMOS transistor 112 may stop conducting once the capacitive load $C_L$ charges to a particular voltage level (e.g., $V_{out} = V_G - V_{TH}$). Thus, the NMOS transistor 112 may be used to transfer relatively low input voltages (e.g., $V_{in} \leq V_G - V_{TH}$) to the output terminal of the CMOS circuit 110.

On the other hand, a conductive path may be formed across the channel of the PMOS transistor 114 when the voltage at the source exceeds the voltage at the gate by at least a threshold voltage (e.g., $V_{SG} \geq V_{TH}$). However, the channel of the PMOS transistor 114 breaks down when the drain-to-gate voltage of the PMOS transistor 114 falls below the threshold voltage $V_{TH}$ (e.g., $V_{DG} < V_{TH}$). As a result, the PMOS transistor 114 may stop conducting once the capacitive load $C_L$ discharges to a particular voltage level (e.g., $V_{out} = V_G + V_{TH}$). Thus, the PMOS transistor 114 may be used to transfer relatively high input voltages (e.g., $V_{in} \geq V_G - V_{TH}$) to the output terminal of the CMOS circuit 110.

By combining the NMOS transistor 112 and PMOS transistor 114 in parallel, the CMOS circuit 110 may transmit a significantly wider range of voltages from the input terminal to the output terminal. Ideally, the output voltage $V_{out}$ of the CMOS circuit 110 should track the input voltage $V_{in}$ when the CMOS circuit 110 is activated. However, parasitic capacitances in the NMOS transistor 112 and/or PMOS transistor 114 may affect the voltage at the output terminal of the CMOS circuit 110. For example, a parasitic capacitance between the gate and source (or drain) of the NMOS transistor 112 may couple the voltage supply line 101 to the output terminal of the CMOS circuit 110. As a result, disturbances (e.g., fluctuations) in the control voltage ($\Delta V_{dda}$) may cause errors in the output voltage ($\Delta V_{out}$). For example, the change in output voltage $\Delta V_{out}$ due to a disturbance on the voltage supply line $\Delta V_{dda}$ may be expressed as a function of the parasitic capacitance ($C_{GS/D}$) of the NMOS transistor 112 and the load capacitance $C_L$:

$$\frac{\Delta V_{out}}{\Delta V_{dda}} = \left( \frac{C_{GS/D}}{C_L} \right)$$

It is noted that, in actual implementations, the output voltage $V_{out}$ of the CMOS circuit 110 may be based, at least in part, on the input voltage $V_{in}$ as well as the control voltage $V_{dda}$. Thus, it may be desirable to reduce or mitigate the noise that is coupled from the voltage supply line to the output terminal of the CMOS circuit 110. As described above, conventional methods of increasing supply rejection have focused on reducing the parasitic capacitance between the gate and source (or drain) of the NMOS transistor 112 and/or increasing the load capacitance $C_L$. However, reducing the parasitic capacitance of the NMOS transistor 112 typically requires reducing the amount of overlap between the gate and source of the NMOS transistor 112, which may result in a corresponding reduction in the overall size of the CMOS circuit 110. This may increase settling times and leakage currents of the CMOS circuit 110. Moreover, increasing the load capacitance $C_L$ may further increase the settling time and/or footprint of the CMOS switching system 100.

Aspects of the present disclosure recognize that, because the error voltage $\Delta V_{out}$ at the output terminal of the CMOS circuit 110 is a function of the noise $\Delta V_{dda}$ in the voltage supply line 101, reducing the noise $\Delta V_{dda}$ in the voltage supply line 101 may result in a corresponding reduction in the error voltage $\Delta V_{out}$. Thus, in some embodiments, the voltage generator 120 may be configured to regulate and/or stabilize the control voltage $V_{dda}$ supplied to the CMOS circuit 110. By regulating the voltage $V_{dda}$ on the supply line 101, the embodiments herein may reduce the error voltage $\Delta V_{out}$ at the output of the CMOS circuit 110 without altering the properties or characteristics of the CMOS circuit 110 and/or capacitive load $C_L$. Thus, the systems and methods of increasing supply noise rejection described herein may result in lower settling times and leakage currents of the CMOS circuit 110 compared to conventional methods of increasing the supply noise rejection of a CMOS switch.

Figure 2:
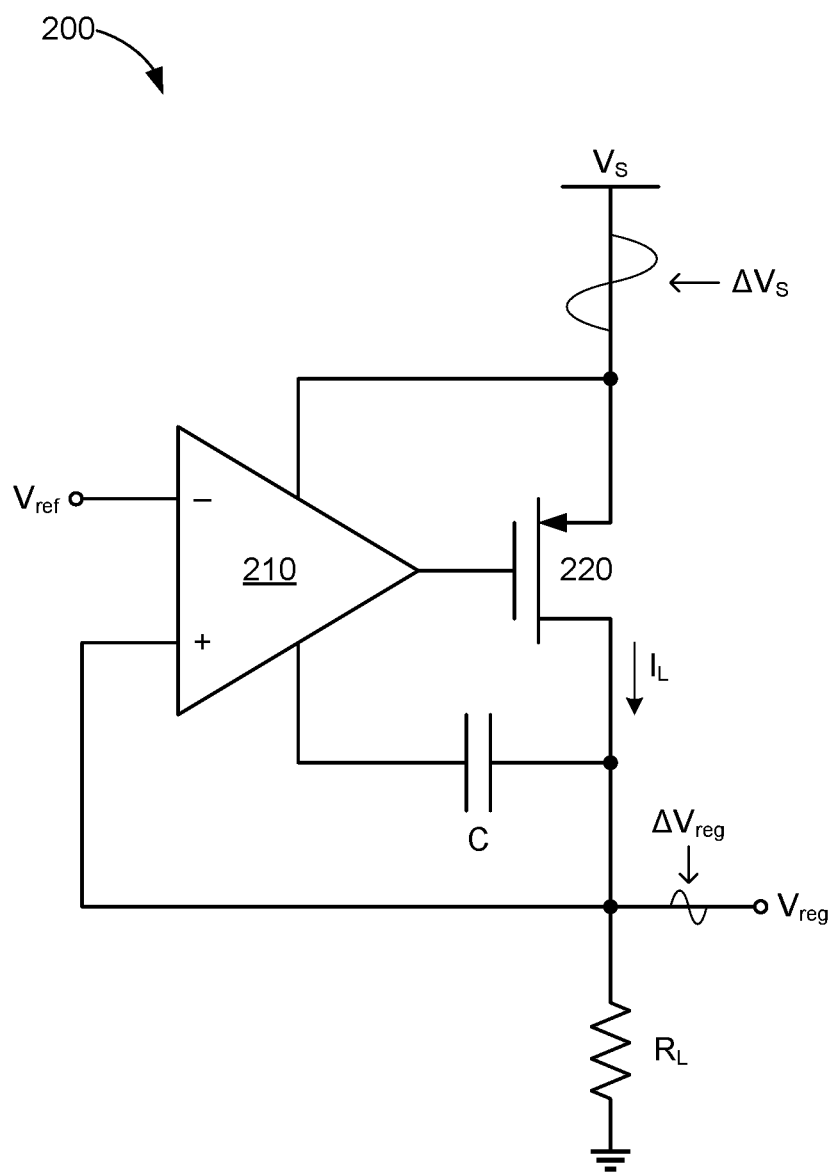
FIG. 2 shows an example voltage regulator that may be implemented in a CMOS switching system, in accordance with some embodiments.

FIG. 2 shows an example voltage regulator 200 that may be implemented in a CMOS switching system, in accordance with some embodiments. The voltage regulator 200 may be configured to regulate a supply voltage ($V_S$) to produce a more stable regulated voltage ($V_{reg}$). In some embodiments, the voltage regulator 200 may be implemented by the voltage generator 120 of FIG. 1 to filter or attenuate disturbances (e.g., noise) in the control voltage $V_{dda}$ provided to the CMOS circuit 110.

The voltage regulator 200 includes an amplifier 210 coupled to a transistor 220. In the example of FIG. 2, the amplifier 210 is depicted as an operational amplifier (op amp) and the transistor 220 is depicted as an PMOS transistor. In some implementations, the amplifier 210 may be powered by the supply voltage $V_S$. For example, as shown in FIG. 2, the positive voltage supply terminal of the amplifier 210 is coupled to the supply voltage $V_S$ and the negative voltage supply terminal of the amplifier 210 is coupled to a resistive load ($R_L$) (e.g., via a capacitor C). The amplifier 210 includes an inverting input (−) terminal coupled to receive a reference voltage $V_{ref}$ and a non-inverting input (+) terminal coupled to the resistive load $R_L$. The output terminal of the amplifier 210 is coupled to the gate of the transistor 220. The source of the transistor 220 is coupled to the supply voltage $V_S$ and the drain of the transistor 220 is coupled to the resistive load $R_L$.

In operation, the transistor 220 facilitates a flow of current ($I_L$) from the supply voltage $V_S$ to the resistive load $R_L$ based, at least in part, on the output of the amplifier 210. Thus, the amplifier 210 may regulate the flow of current $I_L$, and voltage $V_{reg}$, across the resistive load $R_L$ (e.g., $V_{reg}=I_L \cdot R_L$). For example, the amplifier 210 may operate as a linear voltage amplifier to output (and amplify) a difference between the voltages (e.g., $V_{ref}$ and $V_{reg}$) at its input terminals. The reference voltage $V_{ref}$ may be matched to the regulated voltage $V_{reg}$ at the output of the voltage regulator 200. Thus, the difference between the voltages $V_{ref}$ and $V_{reg}$ at the input terminals of the amplifier 210 is configured to be substantially close to zero, causing the amplifier 210 to turn on the transistor 220 and thus enable the flow of current $I_L$ from the supply voltage $V_S$ to the resistive load $R_L$.

In some embodiments, the reference voltage $V_{ref}$ may be held at a relatively stable voltage level (e.g., by coupling a Zener diode to the inverting input terminal of the amplifier 210) corresponding to the desired level of the regulated voltage $V_{reg}$. This allows the amplifier 210 to regulate the flow of current $I_L$ from the supply voltage $V_S$ to the resistive load $R_L$, and thus mitigate disturbances in the supply voltage $V_S$. For example, variations in the amplitude of the supply voltage ($\Delta V_S$) may cause corresponding changes in the current $I_L$ across the load $R_L$, resulting in voltage errors ($\Delta V_{reg}$) at the output of the voltage regulator 200. However, because the amplifier 210 regulates the amount of current $I_L$ flowing through the transistor 220 based on the voltage $V_{reg}$ at the output of the voltage regulator 200 (e.g., in a negative feedback loop), the transistor 220 may reject or resist sudden voltage swings in the supply voltage $V_S$ (e.g., or changes in current $I_L$). Accordingly, the voltage regulator 200 may filter or attenuate disturbances in the supply voltage $V_S$ to produce a relatively stable regulated voltage $V_{reg}$ at its output (e.g., $V_{reg} < \Delta V_S$).

With reference for example to FIG. 1, the regulated voltage $V_{reg}$ may be provided (e.g., as the control voltage $V_{dda}$) to the CMOS circuit 110. Because the regulated voltage $V_{reg}$ is regulated by the voltage regulator 200, any disturbances in the regulated voltage $V_{reg}$ will be significantly smaller than the disturbances that are likely to exist in a voltage rail (e.g., provided by a power supply unit or unregulated power supply). As a result, the disturbances $V_{dda}$ on the voltage supply line 101 are pre-attenuated, resulting in even smaller error voltages $\Delta V_{out}$ at the output of the CMOS circuit 110.

Figure 3:
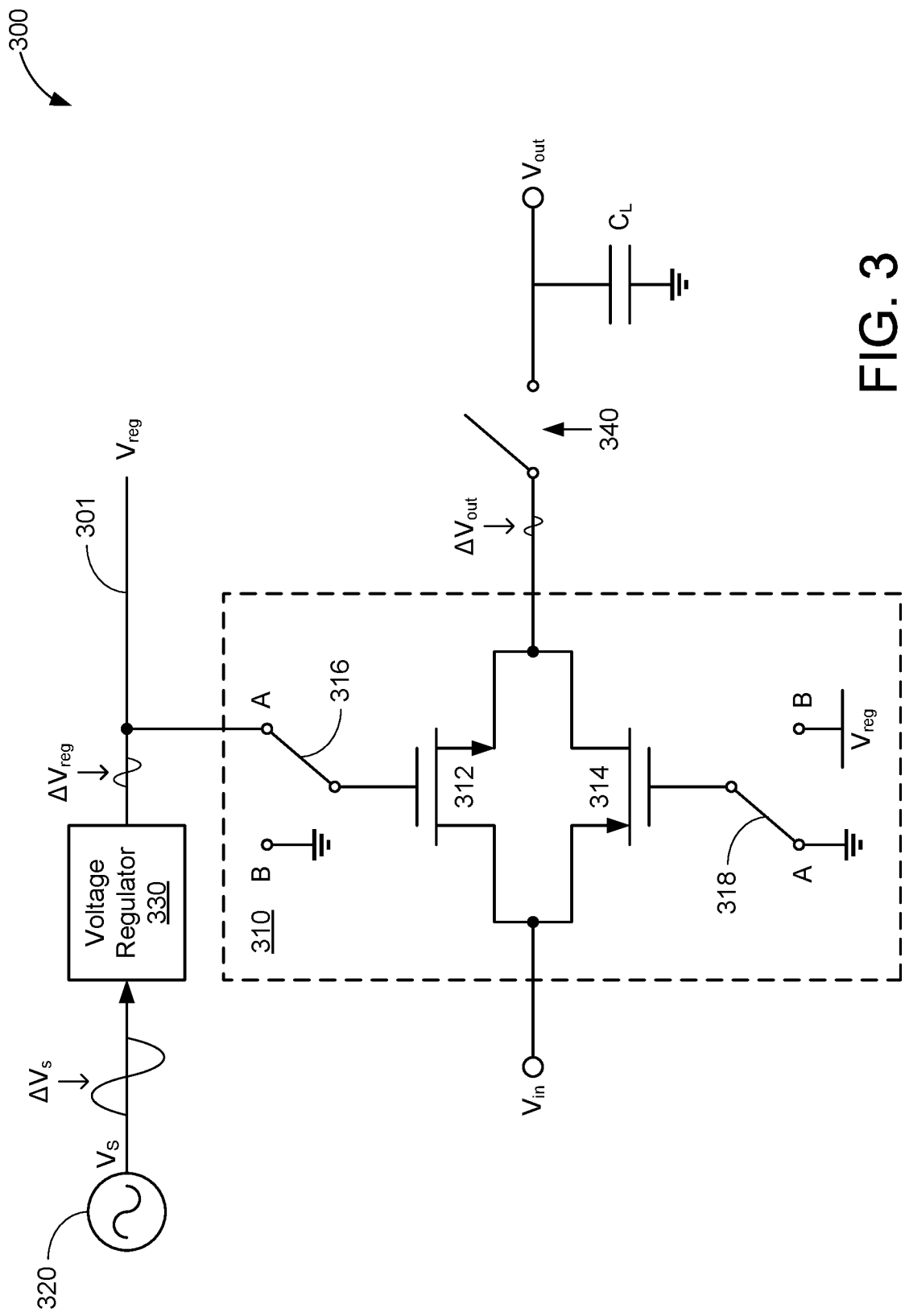
FIG. 3 shows an example CMOS switching system with increased supply rejection, in accordance with some embodiments.

FIG. 3 shows an example CMOS switching system 300 with increased supply rejection, in accordance with some embodiments. The CMOS switching system 300 includes a CMOS circuit 310, a power supply 320, and a voltage regulator 330. The CMOS circuit 310 may be an example embodiment of the CMOS circuit 110 of FIG. 1. Thus, in some embodiments, the CMOS circuit 310 may operate as an analog switch based, at least in part, on a coupling of the CMOS circuit 310 to a voltage supply line 301. More specifically, the voltage regulator 330 may drive the voltage supply line 301 with a regulated voltage $V_{reg}$ which may be used to activate and/or deactivate the CMOS circuit 310.

The CMOS circuit 310 includes an NMOS transistor 312 coupled in parallel with a PMOS transistor 314. In the example of FIG. 3, the drain of the NMOS transistor 312 is coupled to the source of the PMOS transistor 314 to collectively form an input terminal of the CMOS circuit 310. The input terminal of the CMOS circuit 310 may be configured to receive an input voltage $V_{in}$. The source of the NMOS transistor 312 is coupled to the drain of the PMOS transistor 314 to collectively form an output terminal of the CMOS circuit 310. The output terminal of the CMOS circuit 310 may be configured to provide an output voltage $V_{out}$. The gate of the NMOS transistor 312 is switchably coupled to the voltage supply line 301 (e.g., voltage regulator 330) or a ground potential via a first switch 316, and the gate of the PMOS transistor 314 is switchably coupled to the voltage supply line 301 (e.g., voltage regulator 330) or a ground potential via a second switch 318.

The switches 316 and 318 may be coupled in a first configuration (A) or a second configuration (B). In the first configuration (A), the first switch 316 couples the gate of the NMOS transistor 312 to the voltage regulator 330 and the second switch 318 couples the gate of the PMOS transistor 314 to the ground potential. More specifically, when the switches 316 and 318 are in the first configuration, the NMOS transistor 312 and PMOS transistor 314 are turned on, thus activating the CMOS circuit 310 (e.g., causing the CMOS circuit 310 to operate in a conducting state).

In the second configuration (B), the first switch 316 couples the gate of the NMOS transistor 312 to the ground potential and the second switch 318 couples the gate of the PMOS transistor 314 to the voltage regulator 330. More specifically, when the switches 316 and 318 are in the second configuration, the NMOS transistor 312 and PMOS transistor 314 are turned off, thus deactivating the CMOS circuit 310 (e.g., causing the CMOS circuit 310 to operate in a non-conducting state). In some implementations, the switches 316 and 318 may be controlled by an enable signal (not shown for simplicity).

When the switches 316 and 318 are in the first configuration (A), the CMOS circuit 310 may transfer charge or current at the input terminal (e.g., $V_{in}$) to the output terminal (e.g., as described above with respect to FIG. 1). More specifically, the NMOS transistor 312 may facilitate the transfer of relatively-low input voltage (e.g., $V_{in} \leq V_G - V_{TH}$) to the output terminal of the CMOS circuit 310, whereas the PMOS transistor 314 may facilitate the transfer of relatively-high input voltages (e.g., $V_{in} \geq V_G - V_{TH}$) to the output terminal of the CMOS circuit 310.

In some embodiments, the charge or current transferred to the output terminal may be accumulated and stored across a capacitive load ($C_L$). In the example of FIG. 3, the capacitive load $C_L$ is switchably coupled to the CMOS circuit 310 via a track-and-hold (T/H) switch 340. For example, when the switch 340 is closed (e.g., in a "track" mode), charge or current at the output of the CMOS circuit 310 is allowed to accumulate across the capacitive load $C_L$. When the switch 340 is open (e.g., in a "hold" mode), the charge accumulated on the capacitive load $C_L$ is maintained or held constant for a given duration (e.g., so that the voltage $V_{out}$ can be sampled by an analog-to-digital converter (ADC)).

As described above with respect to FIG. 1, parasitic capacitances in the NMOS transistor 312 and/or PMOS transistor 314 may couple disturbances on the voltage supply line 301 to the output terminal of the CMOS circuit 310. This may be problematic for track-and-hold applications, as the error voltage $\Delta V_{out}$ at the output of the CMOS circuit 310 may be stored and maintained on the capacitive load $C_L$ (e.g., when the T/H switch 340 is open). In some implementations, the error voltage $\Delta V_{out}$ may be propagated to an ADC (not shown for simplicity), further resulting in sampling errors. For example, an output voltage of 1V with 1 mv of error (e.g., $V_{out}=1V \pm 1$ mV) may limit the sampling resolution of the ADC to 10 bits.

In some embodiments, the voltage regulator 330 may reduce or minimize the error voltage $\Delta V_{out}$ at the output of the CMOS circuit 310 by attenuating noise on the voltage supply line 301. For example, the voltage regulator 330 may receive a supply voltage $V_S$ from a power supply unit 320. In some aspects, the power supply unit 320 may generate a substantially unregulated voltage rail (e.g., $V_S$). As a result, the supply voltage $V_S$ may exhibit a relatively high amount of noise or variations in amplitude ($\Delta V_S$). However, the voltage regulator 330 may be configured to filter or attenuate the disturbances in the supply voltage $\Delta V_S$ to produce a regulated voltage $V_{reg}$ with little or no variations in amplitude ($\Delta V_{reg}$). In some implementations, the voltage regulator 330 may be an example embodiment of the voltage regulator 200 of FIG. 2. However, other circuitry and/or voltage regulating techniques may be implemented by the voltage regulator 330 to produce a regulated voltage $V_{reg}$ similar to that of the voltage regulator 200.

As described above with respect to FIG. 2, the voltage regulator 330 may produce a regulated voltage $V_{reg}$ that is substantially more stable than the supply voltage $V_S$ from which it is derived (e.g., $\Delta V_{reg} < \Delta V_S$). This noise reduction is passed on to the output terminal of the CMOS circuit 310 (e.g., via the parasitic capacitances of the NMOS transistor 312 and/or PMOS transistor 314), resulting in a significantly reduced error voltage $\Delta V_{out}$. Thus, depending on the amount of attenuation provided by the voltage regulator 330, the CMOS circuit 310 may exhibit little or no error voltage $\Delta V_{out}$ at its output terminal.

For example, assuming the CMOS circuit 310 exhibits 20 dB of supply rejection (e.g., as an inherent characteristic of the gate-to-source and/or gate-to-drain parasitic capacitance of the NMOS transistor 312), coupling a supply voltage $V_S$ with a 10 mV disturbance (e.g., $\Delta V_S = \pm 10$ mV) directly to the voltage supply line 301 (e.g., in lieu of the voltage regulator 330) may produce an error voltage $\Delta V_{out}$ of 1 mV at the output of the CMOS circuit 310 (e.g., $\Delta V_{out} = \pm 1$ mV):

$$\frac{\Delta V_{out}}{\Delta V_S} = \frac{1 \text{ mV}}{10 \text{ mV}} = 20 \text{ dB}$$

However, by filtering the supply voltage $V_S$ through a voltage regulator 330 that exhibits 40 dB of supply rejection (e.g., twice the supply rejection of the CMOS circuit 310), the amount of disturbance on the voltage supply line 301 may be attenuated by two orders of magnitude (e.g., $\Delta V_{reg} = \pm 100$ µV):

$$\frac{\Delta V_{reg}}{\Delta V_S} = \frac{100 \text{ }\mu V}{10 \text{ mV}} = 40 \text{ dB}$$

When combined with the supply rejection of the CMOS circuit 310 (e.g., 20 dB), the error voltage $\Delta V_{out}$ is further reduced to 10 µV at the output of the CMOS circuit 310 (e.g., $\Delta V_{out} = \pm 10$ µV):

$$\frac{\Delta V_{out}}{\Delta V_{reg}} = \frac{10 \text{ }\mu V}{100 \text{ }\mu V} = 20 \text{ dB}$$

This results in an overall supply rejection of 60 dB over the original (e.g., unregulated) supply voltage $V_S$:

$$\frac{\Delta V_{out}}{\Delta V_S} = \frac{\Delta V_{reg}}{\Delta V_S} \cdot \frac{\Delta V_{out}}{\Delta V_{reg}} = 40 \text{ dB} + 20 \text{ dB} = 60 \text{ dB}$$

In some embodiments, the voltage regulator 330 may add additional circuitry and/or hardware components to the CMOS switch. However, aspects of the present disclosure recognize that, in many applications, a voltage regulator may already exist on the same chip as the CMOS circuit 310. Thus, in some embodiments, the CMOS switching system 300 may be constructed with little or no modifications to the existing circuitry or hardware components of the corresponding chip (e.g., by leveraging a voltage regulator 330 that already exists on the chip). For example, in track-andhold applications, the output voltage $V_{out}$ of the CMOS circuit 310 may be sampled by an ADC. More specifically, the ADC may generate the digital sample (e.g., 1 or 0) by comparing the output voltage to a known threshold voltage. To ensure sampling accuracy, the threshold voltage should be relatively stable and is therefore typically generated by a voltage regulator. In some embodiments, a CMOS switch may leverage or reuse the voltage regulator provided for an ADC, for example, by tapping a voltage supply line coupled between the voltage regulator and the ADC.

Figure 4:
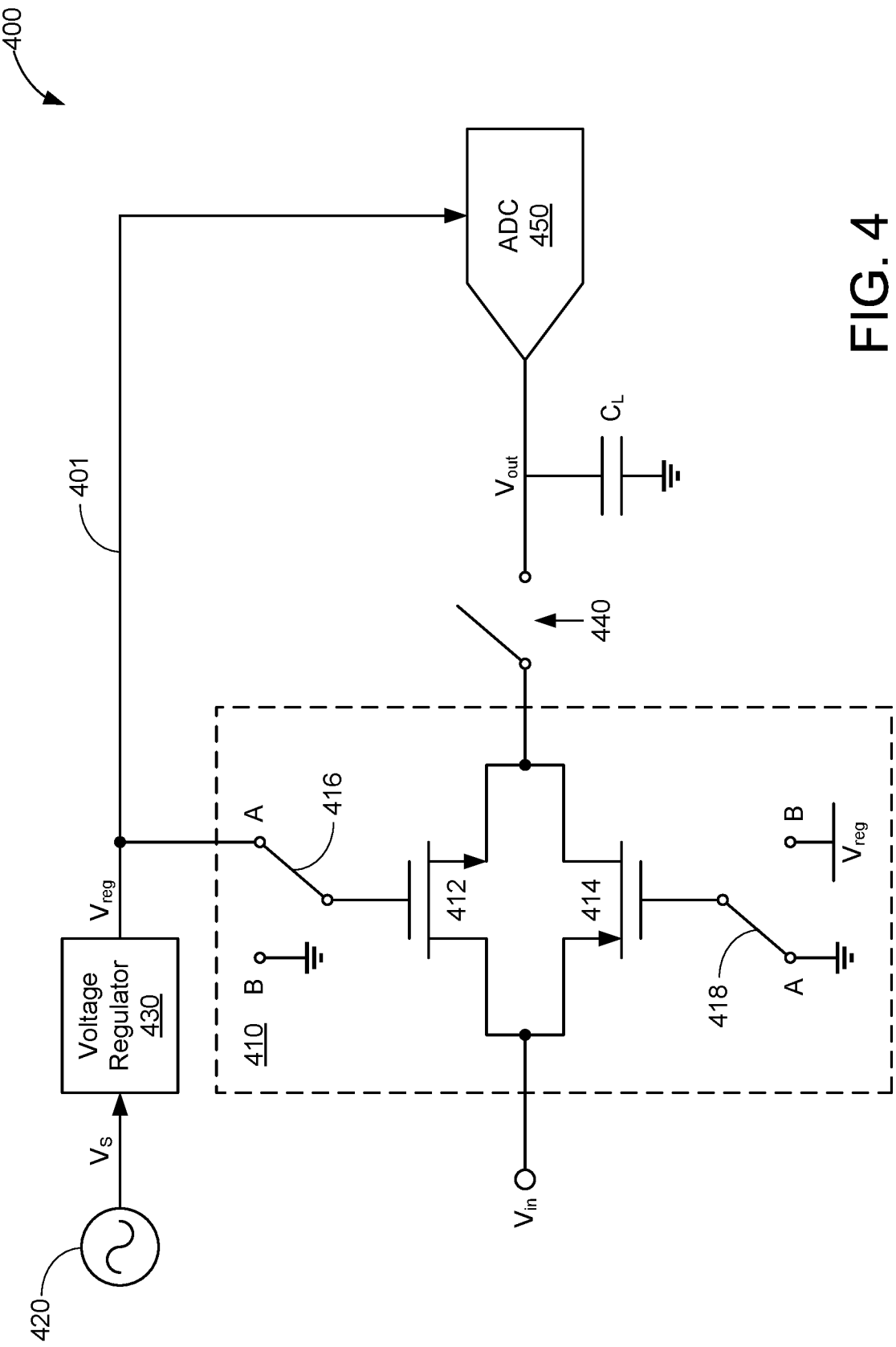
FIG. 4 shows an example CMOS switching system with increased supply rejection, in accordance with some other embodiments.

FIG. 4 shows an example CMOS switching system 400 with increased supply rejection, in accordance with some other embodiments. The CMOS switching system 400 includes a CMOS circuit 410, a power supply 420, a voltage regulator 430, and an analog-to-digital converter (ADC) 450. The CMOS circuit 410 may be an example embodiment of the CMOS circuit 110 of FIG. 1 and/or CMOS circuit 310 of FIG. 3. Thus, in some embodiments, the CMOS circuit 410 may operate as an analog switch based, at least in part, on a coupling of the CMOS circuit 410 to a voltage supply line 401.

The CMOS circuit 410 includes an NMOS transistor 412 coupled in parallel with a PMOS transistor 414. In the example of FIG. 4, the drain of the NMOS transistor 412 is coupled to the source of the PMOS transistor 414 to collectively form an input terminal of the CMOS circuit 410. The input terminal of the CMOS circuit 410 may be configured to receive an input voltage $V_{in}$. The source of the NMOS transistor 412 is coupled to the drain of the PMOS transistor 414 to collectively form an output terminal of the CMOS circuit 410. The output terminal of the CMOS circuit 410 may be configured to provide an output voltage $V_{out}$.

In some embodiments, the output voltage $V_{out}$ may be stored (e.g., as accumulated charge) across a capacitive load ($C_L$). In the example of FIG. 4, the capacitive load $C_L$ is switchably coupled to the CMOS circuit 410 via a track-and-hold (T/H) switch 440. For example, when the switch 440 is closed (e.g., in a "track" mode), charge or current at the output of the CMOS circuit 410 is allowed to accumulate across the capacitive load $C_L$. When the switch 440 is open (e.g., in a "hold" mode), the charge accumulated on the capacitive load $C_L$ is maintained or held constant for a given duration so that the voltage $V_{out}$ can be sampled by the ADC 450.

The ADC 450 may generate a digital sample of the output voltage $V_{out}$ by comparing the output voltage $V_{out}$ with a threshold voltage. For example, the ADC 450 may output a "1" if the output voltage $V_{out}$ exceeds the threshold voltage. On the other hand, the ADC 450 may output a "0" if the output voltage $V_{out}$ is below the threshold voltage. To ensure sampling accuracy, the threshold voltage should be relatively stable. Thus, in some embodiments, the ADC 450 may receive the threshold voltage from the voltage regulator 430 (e.g., as the regulated voltage $V_{reg}$).

The voltage regulator 430 may receive a supply voltage $V_S$ from a power supply unit 420. In some aspects, the power supply unit 420 may generate a substantially unregulated voltage rail (e.g., $V_S$). The voltage regulator 430 may be configured to filter or attenuate the disturbances in the supply voltage $\Delta V_S$ to produce a regulated voltage $V_{reg}$ with little or no variations in amplitude. In some implementations, the voltage regulator 430 may be an example embodiment of the voltage regulator 200 of FIG. 2. However, in other embodiments, different circuitry and/or voltage regulating techniques may be implemented by the voltage regulator 430 to produce a regulated voltage $V_{reg}$ based on the supply voltage $V_S$.

As described above, the CMOS circuit 410 may have relatively poor supply noise rejection. Thus, disturbances in a voltage supply line may be coupled to the output terminal of CMOS circuit 410 (e.g., due to parasitic capacitances in the NMOS transistor 412 and/or PMOS transistor 414). This may be problematic for track-and-hold applications, as the error voltage $\Delta V_{out}$ at the output of the CMOS circuit 410 may be stored and maintained on the capacitive load $C_L$ (e.g., when the T/H switch 440 is open). When the ADC 450 samples the output voltage $V_{out}$ on the capacitive load $C_L$, the error voltage $\Delta V_{out}$ may further cause sampling errors (such as reduced sampling resolution) in the ADC 450.

Aspects of the present disclosure recognize that the regulated voltage $V_{reg}$ provided to the ADC 450 is a substantially stable reference voltage. Thus, in some embodiments, the error voltage $\Delta V_{out}$ at the output of the CMOS circuit 410 may be reduced by tapping the voltage supply line 401 of the ADC 450 and using the regulated voltage $V_{reg}$ to active and/or deactivate the CMOS circuit 410. For example, the gate of the NMOS transistor 412 may be switchably coupled to the voltage supply line 401 (e.g., voltage regulator 430) or a ground potential via a first switch 416, and the gate of the PMOS transistor 414 may be switchably coupled to the voltage supply line 401 (e.g., voltage regulator 430) or a ground potential via a second switch 418.

The switches 416 and 418 may be coupled in a first configuration (A) or a second configuration (B). In the first configuration (A), the first switch 416 couples the gate of the NMOS transistor 412 to the voltage regulator 430 and the second switch 418 couples the gate of the PMOS transistor 414 to the ground potential. More specifically, when the switches 416 and 418 are in the first configuration, the NMOS transistor 412 and PMOS transistor 414 are turned on, thus activating the CMOS circuit 410 (e.g., causing the CMOS circuit 410 to operate in a conducting state).

In the second configuration (B), the first switch 416 couples the gate of the NMOS transistor 412 to the ground potential and the second switch 418 couples the gate of the PMOS transistor 414 to the voltage regulator 430. More specifically, when the switches 416 and 418 are in the second configuration, the NMOS transistor 412 and PMOS transistor 414 are turned off, thus deactivating the CMOS circuit 410 (e.g., causing the CMOS circuit 410 to operate in a non-conducting state). In some implementations, the switches 416 and 418 may be controlled by an enable signal (not shown for simplicity).

When the switches 416 and 418 are in the first configuration (A), the CMOS circuit 410 may transfer charge or current at the input terminal (e.g., $V_{in}$) to the output terminal (e.g., as described above with respect to FIG. 1). More specifically, the NMOS transistor 412 may facilitate the transfer of relatively-low input voltage (e.g., $V_{in} \leq V_G - V_{TH}$) to the output terminal of the CMOS circuit 410, whereas the PMOS transistor 414 may facilitate the transfer of relatively-high input voltages (e.g., $V_{in} \geq V_G - V_{TH}$) to the output terminal of the CMOS circuit 410.

As described above with respect to FIG. 1, parasitic capacitances in the NMOS transistor 412 and/or PMOS transistor 414 may couple disturbances on the voltage supply line 401 to the output terminal of the CMOS circuit 410. However, because the disturbances on the supply line 401 are pre-attenuated by the voltage regulator 430, the supply rejection of the voltage regulator 430 is combined with the supply rejection of the CMOS circuit 410 to produce a significantly reduced error voltage $\Delta V_{out}$ at the output terminal of the CMOS circuit 410 (e.g., as described with respect to FIG. 3). Thus, the CMOS switch 410 may leverage or reuse existing on-chip circuitry (e.g., the voltage regulator 430 provided for the ADC 450) to significantly boost the supply rejection at its output terminal.

Figure 5:
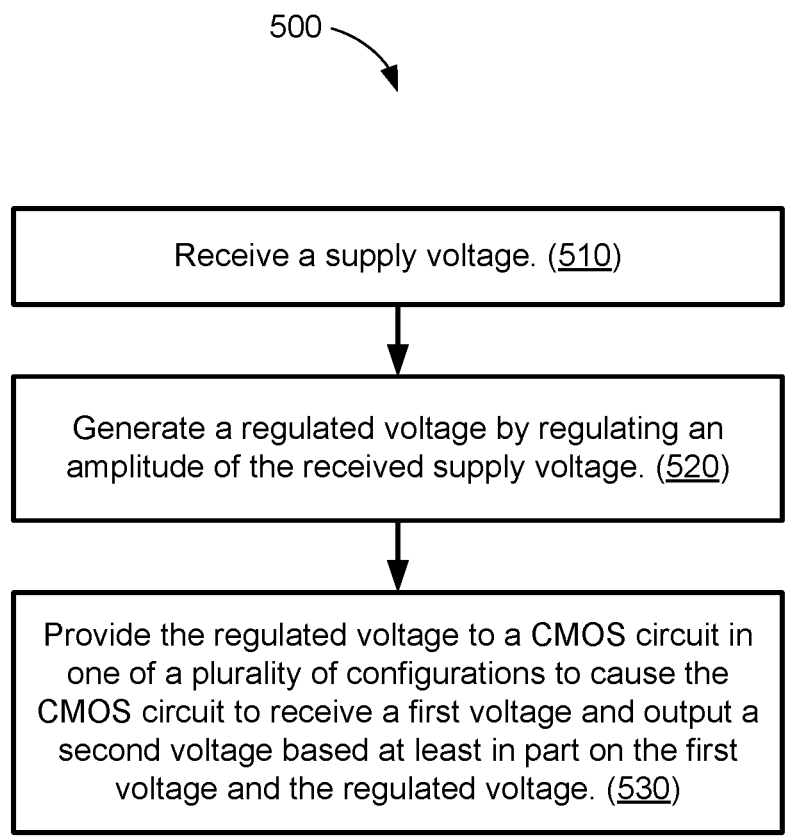
FIG. 5 is an illustrative flow chart depicting an example operation for increasing the supply rejection of a CMOS switch, in accordance with some embodiments.

FIG. 5 is an illustrative flow chart depicting an example operation 500 for increasing the supply rejection of a CMOS switch, in accordance with some embodiments. Although described below with respect to the CMOS switching system 300 of FIG. 3, the example operation 500 may be performed by any suitable CMOS switching system.

The CMOS switching system 300 first receives a receives a supply voltage (510). For example, the voltage regulator 330 may receive the supply voltage $V_S$ from a power supply unit 320. In some aspects, the power supply unit 320 may generate a substantially unregulated voltage rail. As a result, the supply voltage $V_S$ may exhibit a relatively high amount of noise or variations in amplitude.

The CMOS switching system 300 further generates a regulated voltage by regulating an amplitude of the received supply voltage (520). For example, the voltage regulator 330 may be configured to filter or attenuate the disturbances in the supply voltage to produce a regulated voltage $V_{reg}$ with little or no variations in amplitude (e.g., as described above with respect to FIG. 2.

Finally, the CMOS switching system 300 may provide the regulated voltage to a CMOS circuit in one of a plurality of configurations to cause the CMOS circuit to receive a first voltage and output a second voltage based at least in part on the first voltage and the regulated voltage (530). For example, the switches 316 and 318 may selectively couple the CMOS circuit 310 to the voltage regulator 330 to activate the CMOS circuit 310. More specifically, the first switch 316 may couple the gate of the NMOS transistor 312 to the voltage regulator 330 and the second switch 318 may couple the gate of the PMOS transistor 314 to the ground potential, thus activating the CMOS circuit 310 in a conducting state.

As described above with respect to FIG. 1, the output voltage $V_{out}$ of the CMOS circuit 310 may be a function of the input voltage $V_{in}$ and the voltage on the supply line 301 (e.g., the regulated voltage). More specifically, due to parasitic capacitances in the NMOS transistor 312 and/or PMOS transistor 314, disturbances on the voltage supply line may be coupled to the output terminal of the CMOS circuit 310, producing errors in the output voltage $V_{out}$. However, because any disturbances on the supply line 301 are pre-attenuated by the voltage regulator 330 (e.g., by generating a stable regulated voltage $V_{reg}$), the supply rejection of the voltage regulator 330 is combined with the supply rejection of the CMOS circuit 310 to produce a significantly reduced error voltage at the output terminal of the CMOS circuit 310 (e.g., as described with respect to FIG. 3).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A system, comprising:
    a voltage regulator to receive a supply voltage and generate a regulated voltage by regulating an amplitude of the received supply voltage; and
    a complementary metal-oxide-semiconductor (CMOS) circuit including:
        an input terminal to receive a first voltage;
        switching circuitry to selectively couple the CMOS circuit to the voltage regulator in one of a plurality of configurations; and
        an output terminal to output a second voltage based at least in part on the first voltage and the regulated voltage when the CMOS circuit is coupled to the voltage regulator in a first configuration of the plurality of configurations;
    wherein the CMOS circuit further includes an N-type metal-oxide semiconductor (NMOS) transistor to generate the second voltage when the first voltage is below a threshold voltage level, the NMOS transistor comprising:
        a drain coupled to the input terminal;
        a source coupled to the output terminal; and
        a gate switchably coupled to one of the voltage regulator or a ground potential via a first switch of the switching circuitry.

2. The system of claim 1, wherein the voltage regulator is configured to attenuate noise in the supply voltage to stabilize an amplitude of the regulated voltage.

3. The system of claim 1, wherein the first switch is configured to couple the gate of the NMOS transistor to the voltage regulator in the first configuration.

4. The system of claim 1, wherein the CMOS circuit includes a P-type metal-oxide semiconductor (PMOS) transistor to generate the second voltage when the first voltage is above a threshold voltage level, the PMOS transistor comprising:
    a source coupled to the input terminal;
    a drain coupled to the output terminal; and a gate switchably coupled to one of the voltage regulator or a ground potential via a second switch of the switching circuitry.

5. The system of claim 4, wherein the second switch is configured to couple the gate of the PMOS transistor to the ground potential in the first configuration.

6. The system of claim 1, further comprising:
an analog-to-digital converter (ADC) to receive the second voltage from the CMOS circuit and the regulated voltage from the voltage regulator, and to convert the second voltage to a digital sample by comparing the second voltage to the regulated voltage.

7. A system, comprising:
a voltage regulator to receive a supply voltage and generate a regulated voltage by regulating an amplitude of the received supply voltage;
a complementary metal-oxide-semiconductor (CMOS) circuit including:
an NMOS transistor having a drain coupled to an input terminal of the CMOS circuit, a source coupled to an output terminal of the CMOS circuit, and a gate switchably coupled to the voltage regulator;
a PMOS transistor having a drain coupled to the output terminal of the CMOS circuit, a source coupled to the input terminal of the CMOS circuit, and a gate switchably coupled to the voltage regulator; and
switching circuitry to selectively couple the gate of the NMOS transistor or the gate of the PMOS transistor to the voltage regulator.

8. The system of claim 7, wherein the voltage regulator is configured to attenuate noise in the supply voltage to stabilize an amplitude of the regulated voltage.

9. The system of claim 7, wherein the switching circuitry is configured to activate the CMOS circuit by coupling the gate of the NMOS transistor to the voltage regulator.

10. The system of claim 7, wherein the switching circuitry is configured to deactivate the CMOS circuit by coupling the gate of the PMOS transistor to the voltage regulator.

11. The system of claim 7, wherein the CMOS circuit is configured to:
receive a first voltage at the input terminal; and
output a second voltage at the output terminal based at least in part on the first voltage and the regulated voltage when the gate of the NMOS transistor is coupled to the voltage regulator.

12. The system of claim 11, further comprising:
an analog-to-digital converter (ADC) to receive the second voltage from the CMOS circuit and the regulated voltage from the voltage regulator, and to convert the second voltage to a digital sample by comparing the second voltage to the regulated voltage.

13. A method, comprising:
receiving a supply voltage;
generating a regulated voltage by regulating an amplitude of the received supply voltage; and
selectively providing the regulated voltage to a complementary metal-oxide-semiconductor (CMOS) circuit in one of a plurality of configurations to cause the CMOS circuit to:
receive a first voltage; and
output a second voltage based at least in part on the first voltage and the regulated voltage when the regulated voltage is provided to the CMOS circuit in a first configuration of the plurality of configurations;
wherein the CMOS circuit includes an N-type metal-oxide semiconductor (NMOS) transistor to generate the second voltage when the first voltage is below a threshold voltage level, the NMOS transistor comprising:
a drain to receive the first voltage;
a source to output the second voltage; and
a gate to selectively receive the regulated voltage.

14. The method of claim 13, wherein the generating comprises:
attenuating noise in the supply voltage to stabilize an amplitude of the regulated voltage.

15. The method of claim 13, wherein selectively providing comprises:
providing the regulated voltage to the gate of the NMOS transistor in the first configuration.

16. The method of claim 13, wherein the CMOS circuit includes a P-type metal-oxide semiconductor (PMOS) transistor to generate the second voltage when the first voltage is above a threshold voltage level, the PMOS transistor comprising:
a source to receive the first voltage;
a drain to output the second voltage; and
a gate to selectively receive the regulated voltage.

17. The method of claim 16, further comprising:
coupling a ground potential to the gate of the PMOS transistor in the first configuration.

18. The method of claim 13, further comprising:
providing the regulated voltage to an analog-to-digital converter (ADC) to cause the ADC to convert the second voltage to a digital sample by comparing the second voltage to the regulated voltage.

* * * * *